(12) United States Patent
Jeong et al.

(10) Patent No.: US 8,399,048 B2
(45) Date of Patent: Mar. 19, 2013

(54) METHOD FOR FORMING A CATALYST PATTERN USING NANO IMPRINT LITHOGRAPHY

(75) Inventors: Mi Hee Jeong, Daejeon (KR); Hyo Young Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 861 days.

(21) Appl. No.: 12/195,295

(22) Filed: Aug. 20, 2008

(65) Prior Publication Data

US 2009/0148607 A1    Jun. 11, 2009

(30) Foreign Application Priority Data

Dec. 10, 2007    (KR) .................. 10-2007-0127791

(51) Int. Cl.
*B05D 5/12* (2006.01)
*B05D 3/02* (2006.01)
*B05D 3/12* (2006.01)

(52) U.S. Cl. ........ 427/115; 427/229; 427/355; 427/367; 427/369; 427/370

(58) Field of Classification Search .................. 427/115, 427/229, 355, 367, 369, 370
See application file for complete search history.

(56) References Cited

U.S. PATENT DOCUMENTS

| | | | |
|---|---|---|---|
| 6,255,039 B1 * | 7/2001 | Xu et al. | 430/318 |
| 2003/0091789 A1 * | 5/2003 | Koskenmaki et al. | 428/138 |
| 2006/0057450 A1 * | 3/2006 | Morse et al. | 429/35 |

FOREIGN PATENT DOCUMENTS

| | | | |
|---|---|---|---|
| JP | 2006219752 A | * | 8/2006 |
| JP | 2007-258669 | | 10/2007 |
| KR | 1020060107086 A | | 10/2006 |
| KR | 1020070102263 A | | 10/2007 |
| WO | WO 2006005619 A1 | * | 1/2006 |

OTHER PUBLICATIONS

"JP2006219752A translation", machine translation of Nakamura et al., JP2006-219752A.*
Zhang et al. Development of MEMS-based direct methanol fuel cell with high power density using nanoimprint technology, Electrochemistry Communications 9, 1365-1368, Feb. 3, 2007.*
English_nanoimprintsystem.pdf, found at http://www.nact.biz/English_nanoimprintsystem.html, last visited Jul. 13, 2011.*
Materials Selection in Mechanical Design, 3rd ed., M. Ashby, Elsevier, 2005.*
Tait, et al., Growth and sintering of Pd clusters on α-Al2O3 (0001), J. Chem. Phys, 122, 064712, 2005.*
Kim et al., Nanoimprinting of conductive tracks using metal nanopowders, Appl. Phys. Lett. 91, 143117 (2007); published online on Oct. 3, 2007.*

(Continued)

*Primary Examiner* — Katherine A Bareford
*Assistant Examiner* — James M Mellott

(57) ABSTRACT

Provided is a method of patterning a catalyst using nano imprint lithography. The method includes slurrying a catalyst, preparing a stamp for forming a catalyst pattern, forming the catalyst pattern by coating a substrate with the catalyst slurry, imprinting the stamp on the catalyst slurry and performing patterning simultaneously with calcination through nano imprint lithography, and drying the patterned catalyst. As the catalyst pattern is formed through the nano imprint lithography, a surface area of the catalyst increases and it is easy to pattern the catalyst according to the shape of the stamp.

4 Claims, 4 Drawing Sheets

OTHER PUBLICATIONS

Lazarov et al., Oxidation of mehanol on the surfaces of copper-silver alloys, Materials Chemistry, vol. 7, Issue 3, May-Jun. 1982, p. 331-346.*

Orel et al., Coprecipitation of copper/zinc compounds in metal salt-urea-water system, Journal of the European Ceramic Society, 27 (2007) 451-455.*

Seana Seraji et al., "Patterned Microstructure of Sol-Gel Derived Complex Oxides Using Soft Lithography", Adv. Mater. 2000, 12, No. 19, Oct. 2, Wiley-VCH Verlag GmbH, D-69469 Weinheim, 2000, pp. 1421-1424.

Suresh Donthu et al., "Facile Scheme for Fabricating Solid-State Nanostructures Using E-Beam Lithography and Solution Precursors", Published on the web Aug. 4, 2005, American Chemical Society, Nano Letters, 2005, vol. 5, No. 9, pp. 1710-1715.

* cited by examiner

METHOD FOR FORMING A CATALYST PATTERN USING NANO IMPRINT LITHOGRAPHY

CROSS-REFERENCE TO RELATED APPLICATION

This application claims priority to and the benefit of Korean Patent Application No. 2007-127791, filed Dec. 10, 2007, the disclosure of which is incorporated herein by reference in its entirety.

BACKGROUND

1. Field of the Invention

The present invention relates to a method for forming a catalyst pattern using nano-imprinting lithography, and more particularly, to a method for forming a catalyst pattern, in which a nano-imprinting process is performed to fabricate a catalyst pattern, so that a surface area of a catalyst is increased and a desired shape of the catalyst is easily fabricated according to the shape of a stamp.

2. Discussion of Related Art

Inorganic catalysts participating in the existing catalyst reaction are manufactured in various pellet shapes to have mechanical or physical properties with respect to the catalyst reaction. This not only strengthens the physical properties of the catalyst, but also prevents channeling phenomena and pressure drop in the reactor.

Many results of patterning an inorganic material like the inorganic catalyst used in the present invention have been reported.

S. Seraji et al. (Advanced material, 174 (1998) 221) used a soft lithography method to pattern piezoelectric ceramics, i.e., $Pb(ZrTi)O_3(PZT)$ $Sr_2Nb_2O_7$ on a silicon surface using a sol-gel manner. In the state that a polydimethylsiloxane (PDMS) mold was contacted with a silicon surface, the above-prepared material was placed near the PDMS, and the material was filled by a capillary force in the PDMS mold and then dried. After drying, the PDMS mold was removed to thereby form the pattern on the silicon surface.

S. Donthu et al. (Nano letter, 5 (2005) 1710) conducted an experiment in which a polymer pattern was formed by an electron beam lithography (EBL) method; a ferroelectric material (e.g., $PbZr_xTi_{1-x}O_3$-PZT) or an optoelectric material (e.g., ZnO) was spin-coated; and the polymer pattern was lifted off to thereby form a surface pattern. As one of examples where the formed pattern is applied, a ZnO miniaturized device was prepared and its electrical properties were tested. However, there is a limitation in that most reports are applied to a micro electro mechanical system (MEMS).

Accordingly, the present invention proposes a possibility that the inorganic catalyst, which can be used as a reaction catalyst, may be patterned by a nano imprint lithography process.

SUMMARY OF THE INVENTION

The present invention is directed to providing a method for forming a catalyst pattern comprising patterning a catalyst simultaneously with sintering a catalyst through an imprint method.

According to an aspect of the present invention, there is provided a method of patterning a catalyst, comprising: slurrying a catalyst; preparing a stamp for forming a catalyst pattern; forming the catalyst pattern by coating the catalyst slurry on a substrate, contacting the stamp with the coated catalyst and performing patterning the catalyst simultaneously with sintering the catalyst through nano imprint lithography; and drying the patterned catalyst.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Hereinafter, exemplary embodiments of the present invention will be described in detail with reference to the accompanying drawings.

Figure 1:
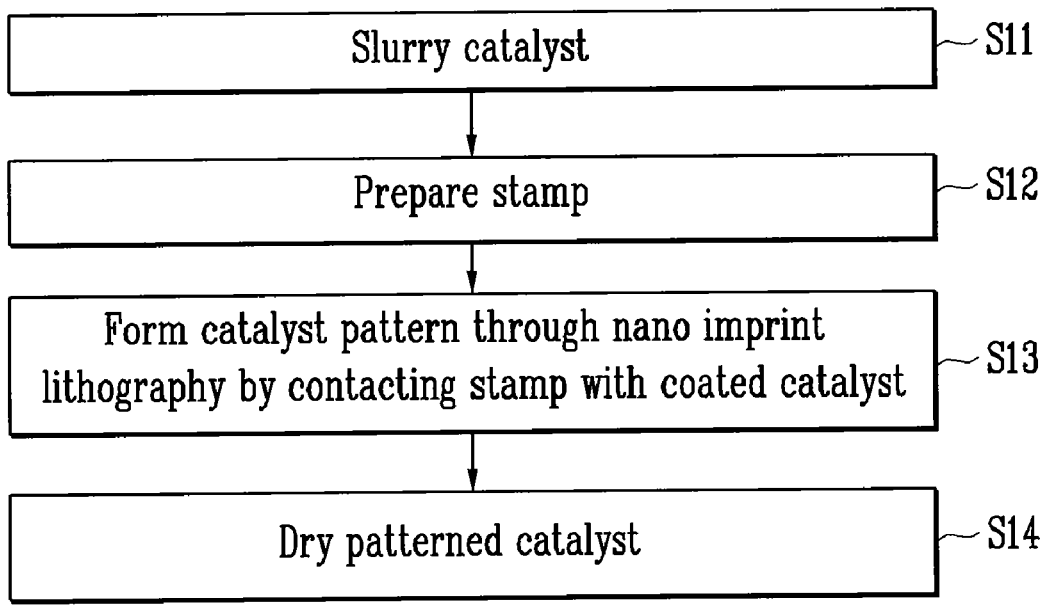
FIG. 1 is a flowchart illustrating a method of patterning a catalyst according to an embodiment of the present invention.
Figure 2:
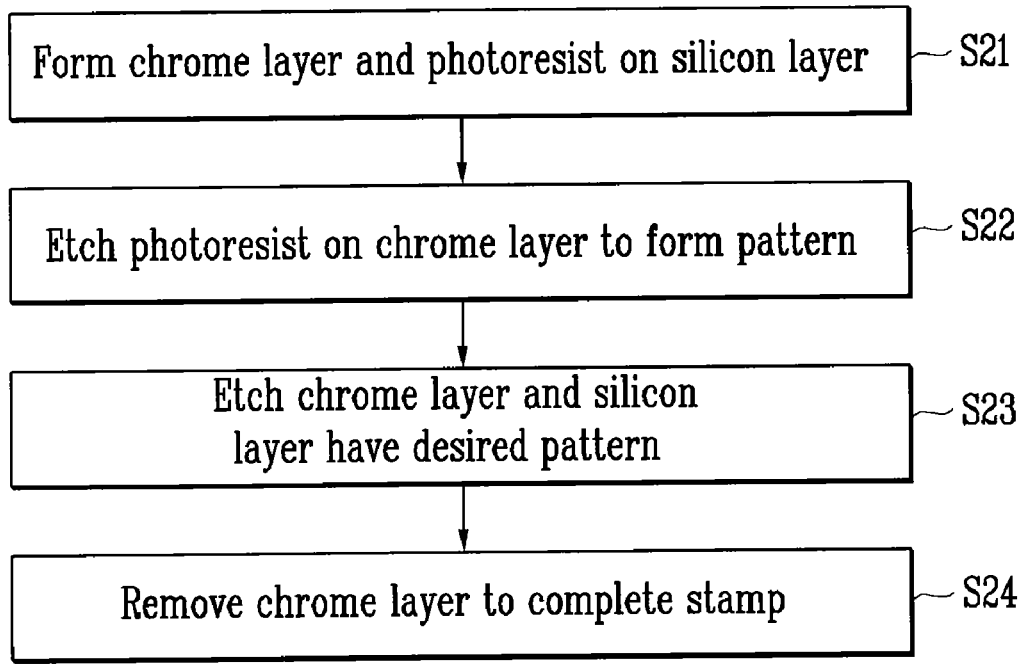
FIG. 2 is a flowchart illustrating a method of preparing a stamp in the catalyst patterning method according to an embodiment of the present invention.
Figure 3:
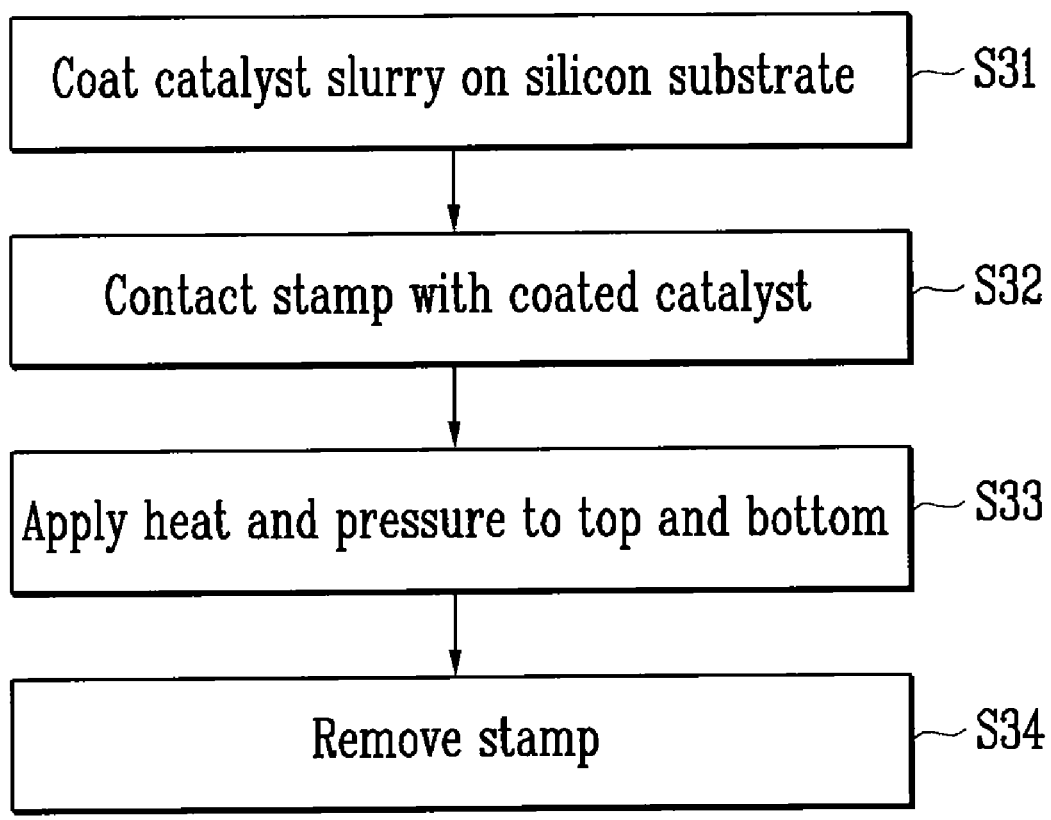
FIG. 3 is a flowchart illustrating a method of patterning a catalyst using a nano imprint lithography method according to an embodiment of the present invention.
Figure 4:
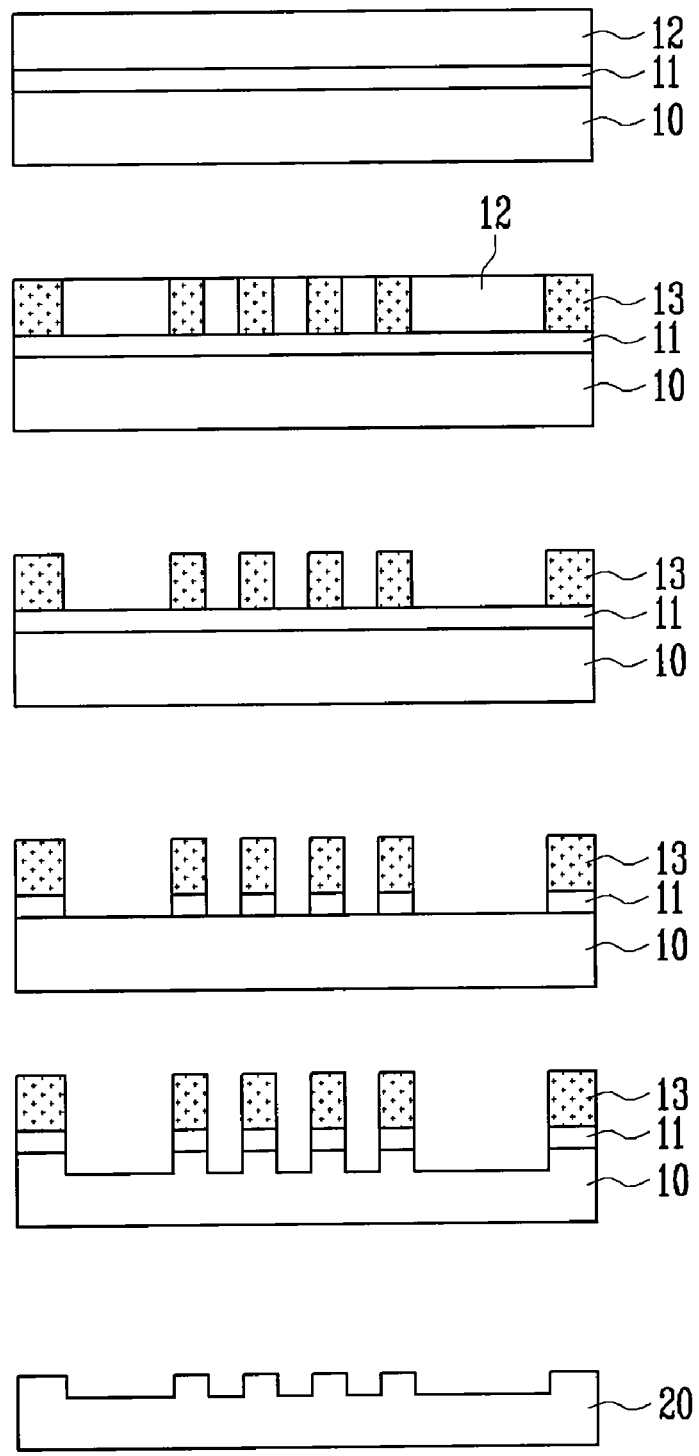
FIG. 4 shows cross-sectional views illustrating sequential processes of preparing a stamp according to an embodiment of the present invention.
Figure 5:
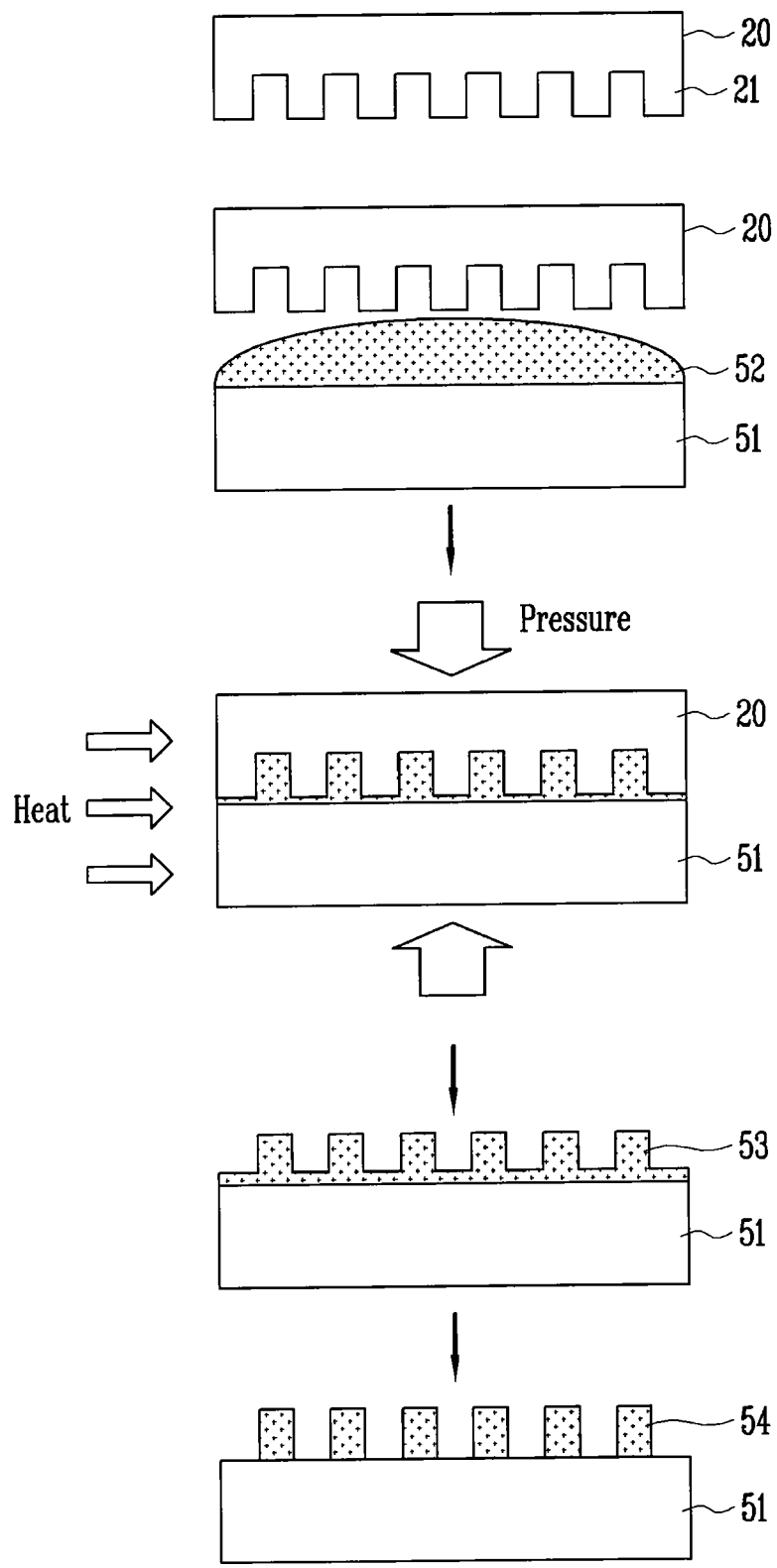
FIG. 5 shows cross-sectional views illustrating sequential processes of patterning a catalyst using a nano imprint lithography method according to an embodiment of the present invention.

FIG. 1 is a flowchart illustrating a method for forming a catalyst pattern according to an embodiment of the present invention, FIG. 2 is a flowchart illustrating a method of preparing a stamp according to an embodiment of the present invention, FIG. 3 is a flowchart illustrating a method for forming a catalyst pattern using a nano imprint lithography method according to an embodiment of the present invention, FIG. 4 shows cross-sectional views illustrating sequential processes of preparing a stamp according to an embodiment of the present invention, and FIG. 5 shows cross-sectional views illustrating sequential processes for forming a catalyst pattern using a nano imprint lithography method according to an embodiment of the present invention.

Referring to FIG. 1, a catalyst patterning method according to an embodiment of the present invention comprises slurrying a catalyst (S11); preparing a stamp for forming a catalyst pattern (S12); forming the catalyst pattern by coating the catalyst slurry on a substrate, contacting the stamp with the coated catalyst and simultaneously performing patterning and sintering the catalyst using a nano imprint lithography process (S13); and drying the patterned catalyst (S14).

In step S11, the slurry may be prepared by mixing the catalyst with a certain solvent. Here, the solvent may be properly selected according to the properties of the catalyst.

The catalyst used in the present invention is a hydrotalcite using carbon dioxide as an adsorbent or a Cu/Zn based methanol synthesis catalyst prepared by a coprecipitation method.

To slurry the catalysts, the catalysts may be mixed with diethylene glycol monoethyl ether acetate by way of example. At this time, the slurry may have a viscosity of 1200 through 1300 cp, and the size of the catalyst to be mixed into the slurry may range from several nm to several μm according to preparation methods for the catalyst.

The hydrotalcite (HT) used as the carbon dioxide adsorbent is a strong basic material, which has a composition of $[M(II)_{1-x}M(III)_x(OH)_2]^{x+}[A_{n-x/n}]^{x-}\cdot yH_2O$ (x=0.1-0.33, A=interlayer anion) or the like. Further, the hydrotalcite (HT) has a dual structure of a divalent metal ion and a trivalent metal ion between which anions exist. Also, a pore size may be adjusted by exchanging the kind of anions or changing a synthesis condition.

In the present embodiment, the hydrotalcite may be prepared according to a ratio of Mg:Al with reference to bibliographies (1) S. Narayanan, K. Krishna, Applied. Catalysis 174 (1998) 221, and (2) A. Corma, V. Fornes, R. M. Martin-Aranda, Journal of Catalysis 134 (1992) 58).

Meanwhile, the methanol synthesis catalyst based on Cu:Zn may be prepared by a coprecipitation method with reference to bibliographies (1) M. Satio et al., Energy Conversion and Management 36 (1995) 577 and (2) H. Arakawa et al., Energy Conversion and Management 33 (1992) 521.

After slurrying the foregoing inorganic catalyst, step S12 of preparing the stamp 20 for forming a pattern is carried out.

As shown in FIGS. 2 and 4, step S12 includes forming a chrome layer 11 and a photoresist 12 to a predetermined thickness on a silicon layer 10 (S21); etching the photoresist 12 on the chrome layer 11 to thereby form a pattern 13 (S22); etching the chrome layer 11 and the silicon layer 10 to thereby form a desired pattern 13 on the silicon layer 10 (S23); and removing the chrome layer 11 to thereby complete the stamp 20 (S24).

In step S21, the chrome layer 11 serves as an adhesive film to adhere the photoresist 12 onto the silicon layer 10. Such an adhesive film may be formed on the silicon layer by a known method generally used in this field.

In step S22, the pattern 13 may be formed by E-beam lithography, but not limited thereto.

In step S23, the silicon layer 10 is etched to have a predetermined thickness according to a desired pattern. Here, the etching method may be properly selected according to the properties of the layer, and the chrome layer 11 and the silicon layer 10 may be etched in sequence or simultaneously. After the chrome layer 11 is etched, the chrome layer 11 may be employed as a mask in etching the silicon.

In step S24, the chrome layer 11 may be completely removed by a general method of this field, e.g., by a lift-off method.

The completed stamp 20 may be processed to have no adhesion to a material to be patterned, thereby facilitating separation. For example, a self-assembly monolayer process is performed on the stamp 20 with (tridecafluoro-1,1,2,2-tetrahydrooctyl)trichlorosilane.

After preparing the stamp 20 as described above, step 13 of forming the catalyst pattern using the stamp 20 is carried out.

As shown in FIGS. 3 and 5, step S13 of forming the catalyst pattern comprises coating the catalyst slurry 52 on a silicon substrate 51 (S31); contacting the stamp 20 with the coated catalyst 52 (S32); applying heat and pressure to the top of the stamp(20) and the bottom of the substrate(51) (S33); and removing the stamp 20 (S34).

In step S31, the catalyst slurry may be coated on the silicon substrate by a general method of this field, e.g., by a spin-coating method. Here, the thickness of the catalyst slurry may be determined variously according to required patterns of the catalyst.

After step S32, in step S33, the heat and the pressure applied to the top of the stamp and bottom of the substrate are employed not only for patterning but also for sintering the catalyst. Here, the pressure and heat may be adjusted according to a calcination temperature of the catalyst. If the catalyst is the hydrotalcite or the Cu:Zn-based synthesis catalyst, the pressure may range from 30 to 150 MPa, and the heat may range from 250 to 350° C.

In step S34, residue 53 may be removed by an etchant after removing the stamp 20. Here, the etchant may be properly selected according to the properties of the residue 53.

Then, step S14 of drying the patterned catalyst is performed. In step S14, a drying temperature may be determined according to the kinds of catalyst. In case of the hydrotalcite or the Cu:Zn-based methanol synthesis catalyst, the drying may be performed at a temperature of 250 through 350° C. for 4 through 6 hours.

Embodiment 1

1. Catalyst Preparation (1) hydrotalcite

① Solution A

| X = Al/(Mg + Al) | Mg/Al atomic ratio | $Mg(NO_3)_2\cdot 6H_2O$(g) | $Al(NO_3)_3\cdot 9H_2O$(g) |
|---|---|---|---|
| 0.33 | 2 | 25.6 | 18.7 |
| 0.25 | 3 | 25.6 | 12.371 |
| 0.17 | 5 | 25.6 | 7.4987 |
| 0.125 | 7 | 25.6 | 5.356 |
| 0.09 | 10 | 25.6 | 3.7489 |

The foregoing reagent was dissolved in deionized water of 70 ml, thereby preparing solution A.

② Solution B

NaOH of 14 g and $Na_2CO_3$ of 10 g were dissolved in deionized water of 100 ml, thereby preparing solution B.

③ Solution A was dropped into solution B for three or four hours at a drop rate of 0.29 through 0.38 mL/min.

④ Produced precipitation was aged at a temperature of 60° C. for 18 hours.

⑤ After filtration, the precipitation was washed with deionized water of 60 through 70° C. until it had a pH level of neutral (about 7).

⑥ The precipitation was dried overnight at 393K.

(2) Methanol Synthesis Catalyst

Through the coprecipitation method using $Na_2CO_3$, a catalyst of $Cu/ZnO/Al_2O_3$ (50:45:5 wt %) was prepared as follows.

① $Cu(NO_3)_2\cdot 3H_2O$(13.82 g), $Zn(NO_3)_2\cdot 6H_2O$(13.82 g), and $Al(NO_3)_2\cdot 9H_2O$(13.82 g) were mixed in distilled water, thereby preparing an aqueous solution of 100 ml.

② A 1M $Na_2CO_3$ aqueous solution of 103.41 ml was prepared.

③ The aqueous solutions of ① and ② were dropped by a syringe pump (Cole-Parmer Co. 74900 series) while stirring 1 l distilled water in a 2 l beaker, thereby producing precipitation. Here, this reaction was performed while maintaining a pH level of 7 at room temperature.

④ After the dropping, the mixture was further stirred for about 1 hour, and then laid aside.

⑤ The precipitation was filtered and washed with distilled water several times, thereby preparing the catalyst.

⑥ The precipitation was dried overnight at 393K.

As prepared above, the hydrotalcite catalyst of 2 through 20 g and the methanol synthesis catalyst of 1 through 10 g were mixed with diethylene glycol monoethyl ether acetate of 5 through 20 ml, thereby preparing the catalyst slurry having a viscosity of 1000 through 1270 cp.

2. Stamp Preparation

After a chrome layer having a thickness of 15 nm was formed on a silicon layer, and the chrome layer was coated with a photoresist (ZEP520A resist) having a thickness of 160 nm, a pattern was formed on the silicon layer using E-beam lithography. Then, the chrome layer was etched using $Cl_2$ inductively coupled plasma (ICP), and the silicon layer was etched to have a desired pattern using ICP $CF_4$ plasma using the etched chrome layer as a mask. At this time, the silicon layer was etched to a thickness of 500 nm. Then, the chrome layer was completely removed by a lift-off method, thereby preparing a stamp having a width of 500 nm and a depth of 500 nm. Further, the stamp was processed by a self-assembly monolayer process with (tridecafluoro-1,1,2,2-tetrahydrooctyl)trichlorosilane to have no adhesion to a material to be patterned, thereby facilitating separation.

3. Catalyst Pattern Forming Method

The slurry of the hydrotalcite catalyst and the methanol synthesis catalyst, prepared in 1, were coated on separate silicon substrates at 5000 rpm for 50 seconds, respectively. The stamp having a pattern was moved down and then was contacted with the coated catalyst. In this state, the contacted stamp, catalyst and silicon substrate were heated at a temperature of 300° C. for 5 hours while applying a pressure of 100 MPa to the top of the stamp and bottom of the substrate. Then, the stamp was removed, and a residue was removed by an etchant consisting of 9 wt % nitric acid, 9 wt % ceric ammonium nitrate and 82 wt % water. Then, drying was performed at a temperature of 150° C. for 5 hours to remove a residual organic matter, thereby completing the catalyst pattern.

As described above, the present invention employs a nano imprint lithography process for patterning a catalyst, so that the catalyst can be patterned for a commercial use and the patterning and sintering processes can be performed simultaneously through the nano imprint lithography process, thereby reducing production costs and enabling mass production. Further, the end catalyst is increased in the surface area, thereby improving reactivity.

Although exemplary embodiments of the present invention have been disclosed for illustrative purposes, those skilled in the art will appreciate that various modifications, additions, and substitutions are possible, without departing from the scope of the present invention. Therefore, the present invention is not limited to the above-described embodiments, but is defined by the following claims, along with their full scope of equivalents.

What is claimed is:

1. A method of patterning a catalyst, comprising:
slurrying a catalyst with a solvent;
preparing a stamp for forming a catalyst pattern;
forming the catalyst pattern by coating the catalyst slurry on a substrate, contacting the stamp with the coated catalyst and performing patterning simultaneously with sintering through nano imprint lithography;
treating the catalyst pattern with an etchant to dissolve solvent residue; and
drying the patterned catalyst to remove the etchant and solvent residue;
wherein the catalyst is hydrotalcite or Cu/ZnO/Al2O3 at 50:45:5 wt %.

2. The method according to claim 1, wherein the preparing of the stamp comprises:
forming a chrome layer and a photoresist having a predetermined thickness on a silicon layer;
etching the photoresist on the chrome layer to form a pattern;
etching the chrome layer and the silicon layer to make the silicon layer have a desired pattern; and
removing the chrome layer to complete the stamp.

3. The method according to claim 1, wherein the forming of the catalyst pattern using the nano imprint lithography comprises:
coating the catalyst slurry on a silicon substrate;
contacting the stamp with the coated catalyst;
applying heat and pressure to the top of the stamp and the bottom of the substrate; and
removing the stamp.

4. The method according to claim 3, wherein the heat and pressure applied to the top and bottom are adjusted according to a sintering temperature of the catalyst.

* * * * *